(12) United States Patent
Lee et al.

(10) Patent No.: US 10,985,220 B2
(45) Date of Patent: Apr. 20, 2021

(54) LIGHT EMITTING DISPLAY DEVICE

(71) Applicant: Samsung Display Co., Ltd., Yongin-si (KR)

(72) Inventors: Sang Woo Lee, Hwaseong-si (KR); Heung Su Park, Uiwang-si (KR); Ji Hwan Yoon, Yongin-si (KR); Jae Hoon Hwang, Seoul (KR)

(73) Assignee: SAMSUNG DISPLAY CO., LTD.

( * ) Notice: Subject to any disclaimer, the term of this patent is extended or adjusted under 35 U.S.C. 154(b) by 0 days.

(21) Appl. No.: 16/510,958

(22) Filed: Jul. 14, 2019

(65) Prior Publication Data

US 2019/0341434 A1 Nov. 7, 2019

Related U.S. Application Data

(62) Division of application No. 15/788,097, filed on Oct. 19, 2017, now Pat. No. 10,388,706.

(30) Foreign Application Priority Data

Mar. 8, 2017 (KR) ........................ 10-2017-0029513

(51) Int. Cl.
 *H01L 27/32* (2006.01)
 *H01L 51/52* (2006.01)

(52) U.S. Cl.
 CPC ...... *H01L 27/3227* (2013.01); *H01L 27/3211* (2013.01); *H01L 27/3213* (2013.01);
 (Continued)

(58) Field of Classification Search
 CPC ............. H01L 27/3213; H01L 27/3211; H01L 27/3227; H01L 27/3267
 See application file for complete search history.

(56) References Cited

U.S. PATENT DOCUMENTS 9,006,713 B2  4/2015  Park et al.
9,048,456 B2  6/2015  Chang et al.
(Continued)

FOREIGN PATENT DOCUMENTS

| KR | 10-2013-0007307 | 1/2013 |
| KR | 10-2013-0007308 | 1/2013 |
| WO | 2015/192649 | 12/2015 |

OTHER PUBLICATIONS

Partial European Search Report dated Jul. 13, 2018, of the corresponding European Patent Application No. 17208432.9.

(Continued)

*Primary Examiner* — Thanhha S Pham

(74) *Attorney, Agent, or Firm* — H.C. Park & Associates, PLC

(57) ABSTRACT

A light emitting display device includes a substrate having a first pixel, a second pixel, a third pixel, and an infrared emission portion. The first, second, and third pixels emit light of different colors. The light emitting device also includes a first electrode on the substrate, a second electrode overlapping the first electrode, an emission layer between the first electrode and the second electrode, and an auxiliary layer between the first electrode and the emission layer. The auxiliary layer includes a first auxiliary layer on the first pixel and a second auxiliary layer in the infrared emission portion. The first auxiliary layer and second auxiliary layer include a same material.

16 Claims, 14 Drawing Sheets

(52) U.S. Cl.
CPC ...... *H01L 27/3269* (2013.01); *H01L 51/5265* (2013.01); *H01L 27/323* (2013.01)

(56) References Cited

U.S. PATENT DOCUMENTS

| | | | |
|---|---|---|---|
| 9,466,653 | B2 | 10/2016 | De Jong et al. |
| 2008/0074401 | A1* | 3/2008 | Chung ................ G02F 1/1368 345/175 |
| 2014/0034911 | A1 | 2/2014 | Liu et al. |
| 2014/0091287 | A1 | 4/2014 | Sago |
| 2015/0243712 | A1 | 8/2015 | Wang et al. |
| 2015/0331508 | A1 | 11/2015 | Nho et al. |
| 2015/0364527 | A1 | 12/2015 | Wang et al. |
| 2016/0033822 | A1 | 2/2016 | Jiang et al. |
| 2017/0123542 | A1 | 5/2017 | Xie et al. |

OTHER PUBLICATIONS

European Search Report dated Oct. 18, 2018.
Non-Final Office Action dated Sep. 20, 2018, issued in U.S. Appl. No. 15/788,097.
Notice of Allowance dated Apr. 5, 2019, issued in U.S. Appl. No. 15/788,097.
Office Action dated Feb. 4, 2021, issued to European Patent Application No. 17208432.

* cited by examiner

LIGHT EMITTING DISPLAY DEVICE

CROSS-REFERENCE TO RELATED APPLICATIONS

This application is a Divisional of U.S. patent application Ser. No. 15/788,097, filed on Oct. 19, 2017, which claims priority from and the benefit of Korean Patent Application No. 10-2017-0029513, filed on Mar. 8, 2017, and entitled: "Light Emitting Display Device," is incorporated by reference herein in its entirety.

BACKGROUND

1. Field

One or more embodiments herein relate to a light emitting display device.

2. Description of the Related Art

A variety of light emitting elements have been developed. One type of light emitting element emits light based on excitons formed when holes injected from an anode and electrons injected from a cathode electrode combine in an organic emission layer. A display panel constructed from light emitting elements of this type may have a wide viewing angle, high response speed, reduced thickness, and low power consumption. Such a display panel may be suitable in various electric and electronic devices, not the least of which include televisions, monitors, and mobile phones.

However, an additional sensor module may be required to implement a sensor in a display device that includes such light emitting elements. The additional sensor module may require additional processes and also may increase costs.

SUMMARY

In accordance with one or more embodiments, a light emitting display device includes a substrate including a first pixel, a second pixel, a third pixel, and an infrared emission portion, the first pixel, the second pixel, and the third pixel to emit light of different colors; a first electrode on the substrate; a second electrode overlapping the first electrode; an emission layer between the first electrode and the second electrode; and an auxiliary layer between the first electrode and the emission layer, wherein the auxiliary layer includes a first auxiliary layer on the first pixel and a second auxiliary layer in the infrared emission portion, and wherein the first auxiliary layer and the second auxiliary layer include a same material.

The first auxiliary layer and the second auxiliary layer may be in a same layer. The light emitting display device may include an infrared emission layer in the infrared emission portion, wherein the infrared emission layer is on the second auxiliary layer. The infrared layer emission layer may be in a same layer as the emission layer. The emission layer may include a first emission layer in the first pixel; and a second emission layer in the infrared emission portion, wherein the first emission layer and the second emission layer include a same material. The first emission layer and the second emission layer may be in a same layer.

The light emitting display device may include an infrared emission layer in the infrared emission portion, wherein the infrared emission layer is on the second emission layer. The auxiliary layer may include a third auxiliary layer in the second pixel and a fourth auxiliary layer between the infrared emission layer and the second emission layer, the third auxiliary layer and the fourth auxiliary layer including a same material. The third and fourth auxiliary layers may be in a same layer.

The first pixel, the second pixel, and the third pixel may respectively correspond to a green pixel, a red pixel, and a blue pixel, and the first auxiliary layer of the first pixel may be in a same layer as the second auxiliary layer. A wavelength generated from the infrared emission portion may be in a range of about 700 nanometers to about 1000 nanometers.

In accordance with one or more other embodiments, a light emitting display device includes a substrate including a first pixel, a second pixel, a third pixel, and an infrared sensor portion, the first pixel, the second pixel, and the third pixel to emit light of different colors; a first electrode on the substrate; a second electrode overlapping the first electrode; and an emission layer between the first electrode and the second electrode, wherein the infrared sensor portion includes an infrared emission portion and an infrared receiving portion and wherein the infrared emission portion and the infrared receiving portion are between neighboring pixels among the first pixel, the second pixel, and the third pixel.

The first pixel, the second pixel, and the third pixel may be arranged along a first direction, and the infrared emission portion and the infrared receiving portion may be arranged along a second direction crossing the first direction. The first pixel, the second pixel, and the third pixel may be arranged along a first direction, and the infrared emission portion and the infrared receiving portion may be arranged along the first direction. The first pixel, the second pixel, and the third pixel may be between the infrared emission portion and the infrared receiving portion.

The infrared emission portion may be between the first pixel and the second pixel, the first pixel, the infrared emission portion, and the second pixel may be arranged along a first direction, and the first pixel, the second pixel and the infrared receiving portion may be arranged along a second direction crossing the first direction. At least one of the infrared emission portion and the infrared receiving portion may be arranged along a third direction with the first pixel and the second pixel and along a fourth direction crossing the third direction with the third pixel.

A transparent window and a sensor layer may be in the infrared receiving portion, and the transparent window and the sensor layer may overlap each other along a direction crossing an upper surface of the substrate. The sensor layer may be between the substrate and the first electrode. The transparent window may include a transparent conductive material.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
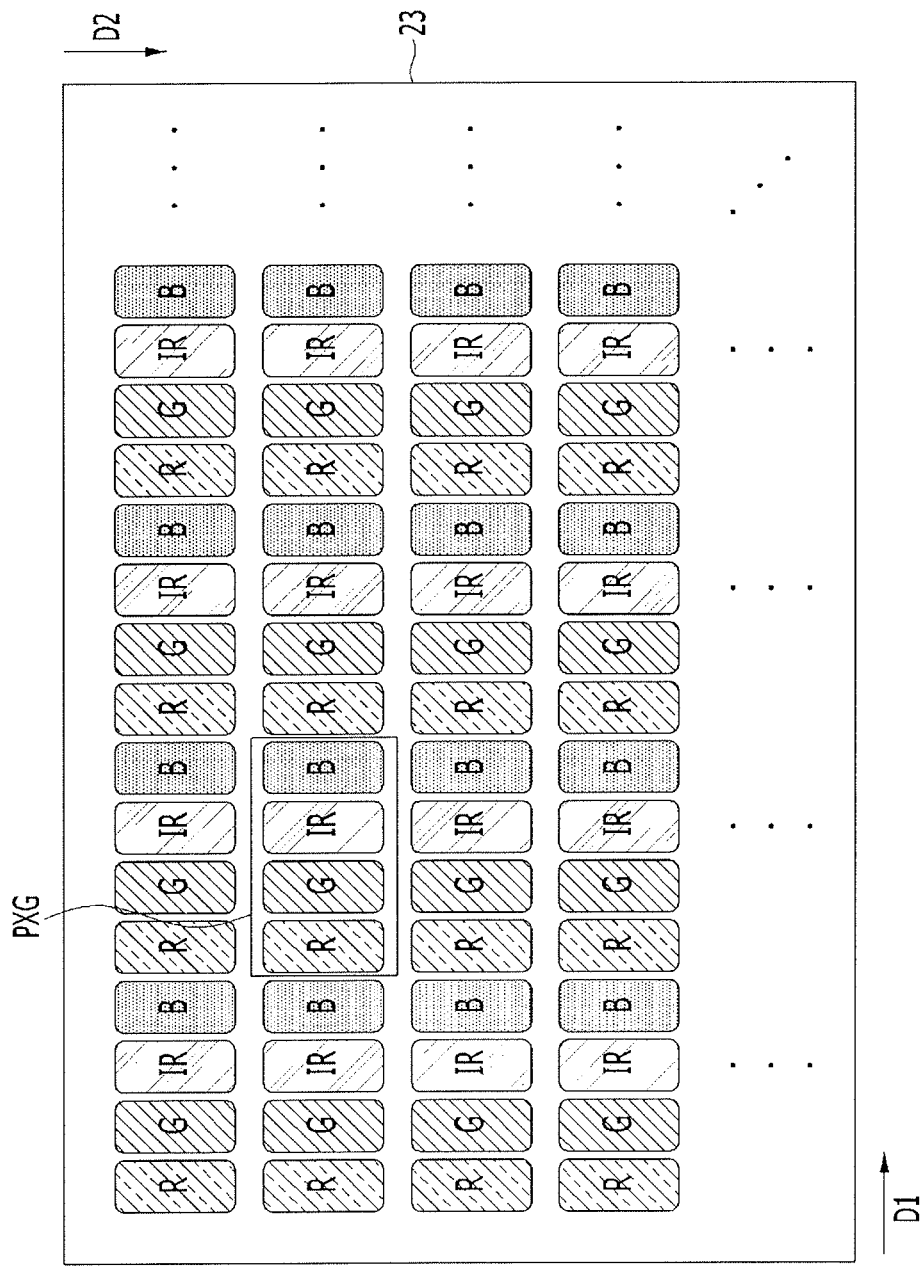
FIG. 1 illustrates an embodiment of pixels and an infrared ray emission portion.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a top plan view of an embodiment of pixels and an infrared ray emission portion, which, for example, may be included in a light emitting display device. Referring to FIG. 1, a substrate 23 includes first pixels, second pixels, third pixels, and an infrared ray emission portion IR. The first pixels, second pixels, and third pixels respectively emit light of different colors, e.g., green (G), red (R), and blue (B). The first, second, and third pixels may emit light of a different combination of colors in another embodiment.

In a plan view, the first pixels G, the second pixels R, the third pixels B, and the infrared ray emission portion IR may be in a predetermined arrangement. For example, the first, second, and third pixels and the infrared ray emission portion IR may be alternately arranged in the order of the second pixels R, the first pixels G, the third pixels B, and the infrared ray emission portion IR along a first direction D1. The same pixels or the infrared ray emission portions IR may be arranged along a second direction that crosses the first direction D1. In this case, the infrared ray emission portion IR is between the first pixel G and the third pixel B. The infrared ray emission portion IR may be between the first pixel G and the second pixel R or between the second pixel R and the third pixel B. The first, second, and third pixels and the infrared ray emission portion IR may have another arrangement in a different embodiment.

The pixels R, G, and B may be minimum units for representing brightness and darkness. The infrared ray emission portion IR may indicate an area that emits infrared rays in a predetermined range (e.g., about 700 nanometers to about 1000 nanometers) in order to serve, for example, as an illumination sensor, a proximity sensor, a finger identification sensor, an iris identification sensor, or a vein sensor. In FIG. 1, the second pixel R, the first pixel G, the infrared ray emission portion IR, and the third pixel B may form one pixel group PXG. A plurality of pixel groups PXG may disposed in a predetermined arrangement (e.g., vertically and horizontally arranged along the first direction D1 and the second direction D2) on the substrate 23.

In FIG. 1, pixel groups PXG of the second pixel R, the first pixel G, the infrared ray emission portion IR, and the third pixel B are iteratively arranged. In at least one embodiment, the infrared ray emission portion IR are in some of the pixel groups PXG, but not all of the pixel groups PXG. For example, a first pixel group formed of the second pixel R, the first pixel G, and the third pixel B, and a second pixel group PXG formed of the second pixel R, the first pixel G, the infrared ray emission portion IR, and the third pixel B, may be alternately arranged along the first direction D1, or one second pixel group may be alternately arranged for every two first pixel groups along the first direction D1. In different embodiments, the pixel groups PXG may be arranged on the substrate 23 using various other methods. In this case, the pixel groups may be arranged with regularity for accuracy in sensing.

Figure 2:
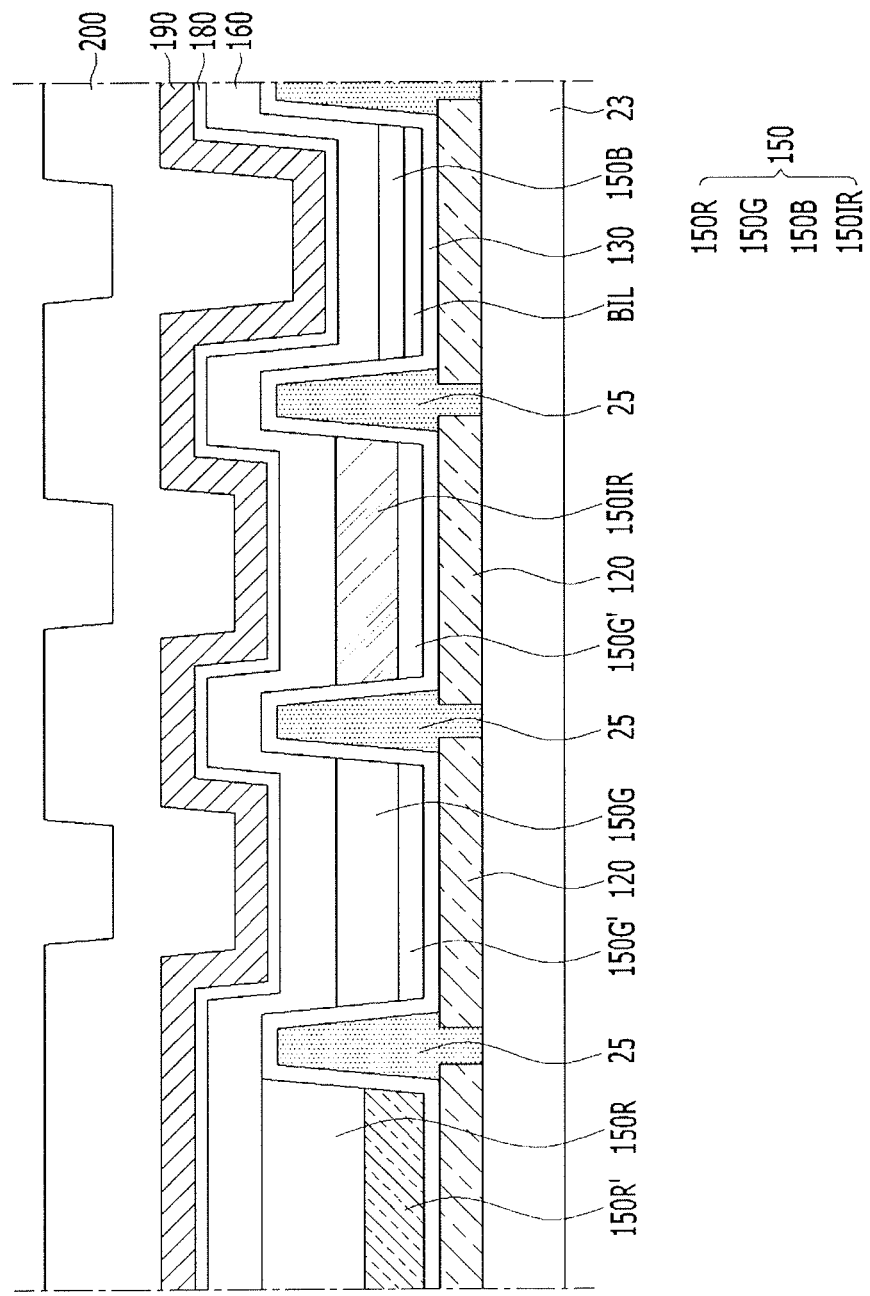
FIG. 2 illustrates an embodiment of a group of pixels in FIG. 1.

FIG. 2 illustrates a cross-sectional structure of an embodiment of a pixel group, which, for example, may be representative of one or more of the pixel groups PXG of FIG. 1. Light emitting elements that respectively correspond to the second pixel R, the first pixel G, the infrared ray emission portion IR, and the third pixel B in FIG. 1 are on the substrate 23 in FIG. 2.

Referring to FIG. 2, a light emitting display device according to the present exemplary embodiment includes a first electrode 120 on the substrate 23, a second electrode 190 that overlaps the first electrode 120, an emission layer 150 between the first electrode 120 and the second electrode 190, a hole transport layer 130 between the first electrode 120 and the emission layer 150, an electron transport layer 160 between the emission layer 150 and the second electrode 190, an electron injection layer 180 between the electron transport layer 160 and the second electrode 190, and a capping layer 200 between the electron injection layer 180 and the second electrode 190.

In the present exemplary embodiment, the first electrode 120 may be a reflective electrode, e.g., an electrode that includes a material having a light reflective property for transmission of light emitted from the emission layer 150 to the second electrode 190. The light reflective property may imply that reflectance with respect to incident light is in a predetermined range, e.g., more than about 70% or less than about 100%, or more than about 80% or less than about 100%.

The first electrode 120 may include, for example, silver (Ag), aluminum (Al), chromium (Cr), molybdenum (Mo), tungsten (W), titanium (Ti), gold (Au), palladium (Pd), or an alloy thereof. The first electrode 120 may have a three-layer structure, e.g., a three-layer structure of silver (Ag)/indium tin oxide (ITO)/silver (Ag), a three-layer structure of indium tin oxide (ITO)/silver (Ag)/indium tin oxide (ITO), or another three-layer structure. The first electrode 120 may be formed, for example, by a sputtering method, a vapor phase deposition method, an ion beam deposition method, or an electron beam deposition method.

The hole transport layer 130 may correspond to an auxiliary layer between the first electrode 120 and the emission layer 150. The hole transport layer 130 may include at least one of a hole injection layer (HIL), and a hole transport layer (HTL). The hole injection layer (HIL) eases injection of holes from the first electrode 120. The hole transport layer (HTL) eases transport of holes transmitted from the hole injection layer. The hole transport layer 130 may have a double-layer structure in which the hole transport layer is on the hole injection layer, or may be provided as a single-layer formed by a mixture of a material that forms the hole injection layer and a material that forms the hole transport layer.

The hole transport layer 130 may include an organic material. For example, the hole transport layer 130 may include NPD (N,N-dinaphthyl-N,N'-diphenyl benzidine), TPD (N,N'-bis-(3-methylphenyl)-N,N'-bis-(phenyl)-benzidine), or s-TAD, MTDATA (4,4',4"-tris(N-3-methylphenyl-N-phenyl-amino)-triphenylamine).

The emission layer 150 is on the hole transport layer 130 and includes a light emission material to emit light of a specific color. For example, the emission layer 150 may emit a primary color light, such as blue, green, and red, or a combination of these or other colors.

The emission layer 150 may have a thickness in a predetermined range, e.g., 10 nm to 50 nm. The emission layer 150 includes a host and a dopant. The emission layer 150 includes a red emission layer 150R, a green emission layer 150G, an infrared ray emission layer 150IR, and a blue emission layer 150B horizontally arranged in a direction parallel with an upper surface of the first electrode 120.

The hole transport layer 130 is commonly between the red emission layer 150R and the first electrode 120, between the green emission layer 150G and the first electrode 120, between the infrared ray emission layer 150IR and the first electrode 120, and between the blue emission layer 150B and the first electrode 120. The thickness of the hole transport layer 130 may be substantially constant in portions where the hole transport layer 130 is commonly disposed.

The red emission layer 150R includes a host material that includes, for example, carbazole biphenyl (CBP) or mCP (1,3-bis(carbazol-9-yl), and may be formed of a phosphorescent material including a dopant material including at least one of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), or PtOEP (octaethylporphyrin platinum), or alternatively may be formed of a fluorescent material including but not limited to PBD:Eu(DBM)3(Phen) or perylene.

The green emission layer 150G includes a host material that includes, for example, CBP or mCP, and may be formed of a phosphorescent material including a dopant material such as but not limited to Ir(ppy)3 (fac-tris(2-phenylpyridine)iridium), or alternatively may be formed of a fluorescent material such as but not limited to Alq3 (tris(8-hydroxyquinolino)aluminum).

The blue emission layer 150B includes a host material including, for example, CBP or mCP, and may be formed of a phosphorescent material including a dopant material such as but not limited to (4,6-F2ppy)2Irpic. As an alternative, the blue emission layer 150B may include a host material including an anthracene group and, for example, may be formed of a fluorescent material that includes one of spiro-DPVBi, spiro-6P, distyrylbenzene (DSB), distyrylarylene (DSA), a PFO-based polymer, or a PPV-based polymer.

In the present exemplary embodiment, each of the red emission layer 150R, the green emission layer 150G, and the blue emission layer 150B may include an organic material. In one embodiment, the red emission layer 150R, the green emission layer 150G, and the blue emission layer 150B may be made of an inorganic material such as but not limited to quantum dots.

In the present exemplary embodiment, the infrared ray emission layer 150IR may be formed, for example, by doping an infrared ray light emitting dopant to a pixel light emitting material or a resonance auxiliary layer material. The pixel light emitting material may be the above-described host material of the red emission layer 150R or the green emission layer 150G. The resonance auxiliary layer material may be a material included in the hole transport layer 130.

The infrared ray emitting dopant in the infrared ray emission layer 150IR may have a predetermined wavelength range, e.g., about 700 nanometers to about 1000 nanometers. For example, the wavelength range of the infrared ray emitting dopant may be about 850 nanometers to 950 nanometers. In order to have such a wavelength range, the infrared ray emitting dopant according to the present exemplary embodiment may include, for example, at least one of a metal complex compound, a donor-acceptor-donor (DAD) compound, or a lanthanide compound.

In the present exemplary embodiment, the metal complex compound may include Pt, Pd, Cu, or Zn. The metal complex compound according to the present exemplary embodiment may be a compound represented by Chemical Formula 1.

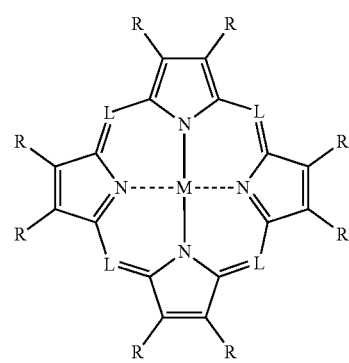

Chemical Formula 1

In Chemical Formula 1, L may denote N or CR' and M may denote Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, lanthanides, or actinides. R is A(Cl), B(Br), C(I), D(At), and E (a group including an atom coupled to a beta (β) carbon of a pyrrole ring), where the atom coupled to the beta (β) carbon is B, C, N, O, Si, P, S, Cl, Ge, As, Se, Br, In, Sn, Sb, Te, I, Tl, Pb, Bi, Po, or At. Two adjacent R groups coupled to the same pyrrole ring may form a carbocyclic group or a heterocyclic group together with two β carbons. In CR', R' may be a phenyl group, a tolyl group, a xylenyl group, a mesityl group, a methyl group, an ethyl group, an n-propyl group, or an isopropyl group.

The metal complex compound represented Chemical Formula 1 may be, for example, any one of Chemical Formula 1-1 to Chemical Formula 1-10. The metal complex compound is not limited to the stated type of metal complex compound. Chemical Formula 1-1 may be Pt(TPBP) (Pt-tetraphenyltetrabenzoporphyrin).

Chemical Formula 1-1

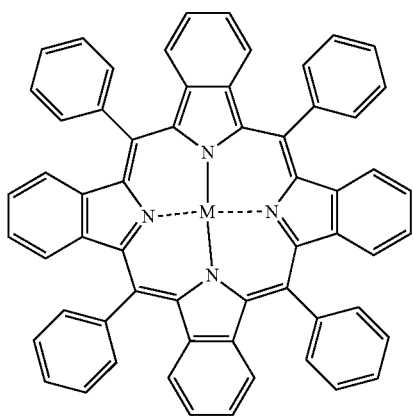

Chemical Formula 1-2

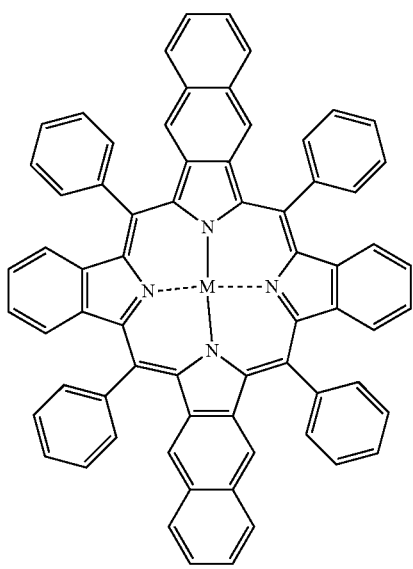

Chemical Formula 1-3

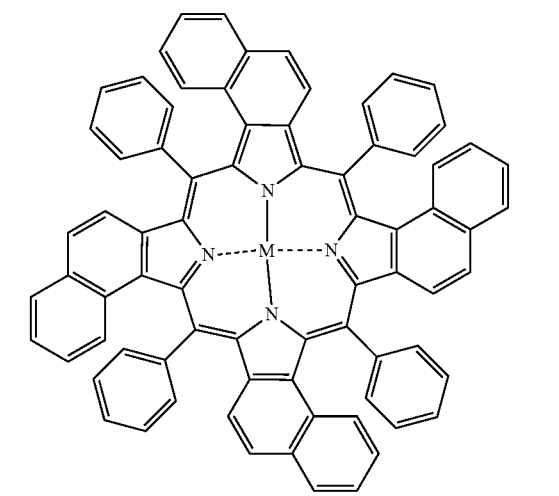

Chemical Formula 1-4

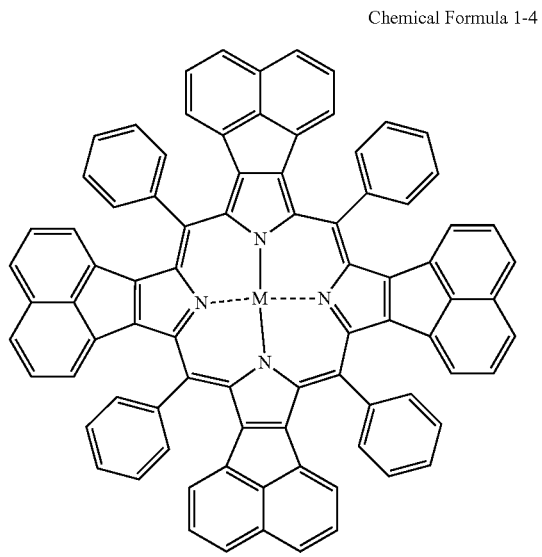

Chemical Formula 1-5

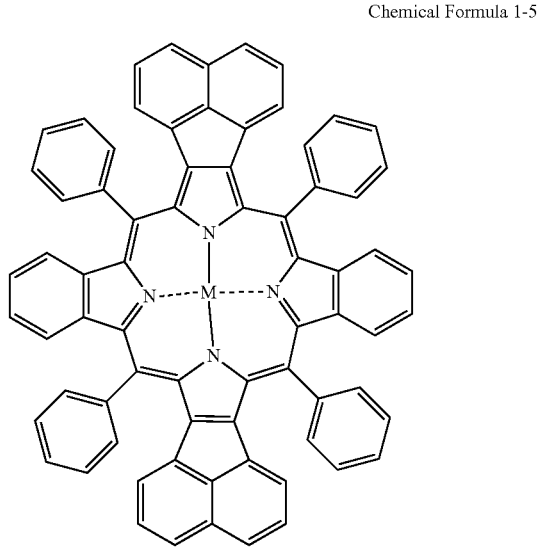

-continued

Chemical Formula 1-6

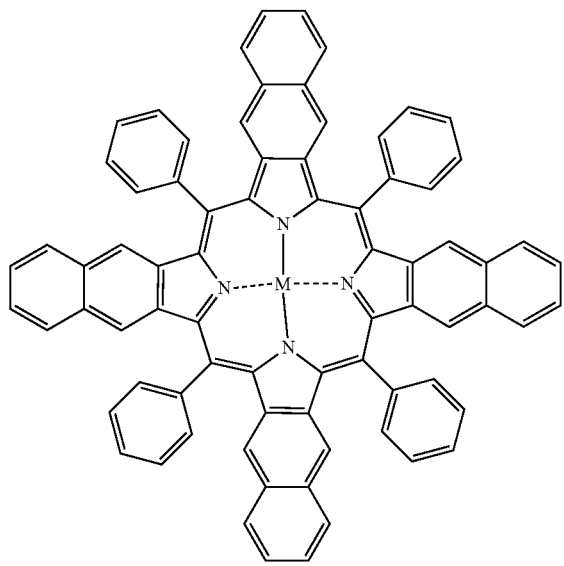

Chemical Formula 1-7

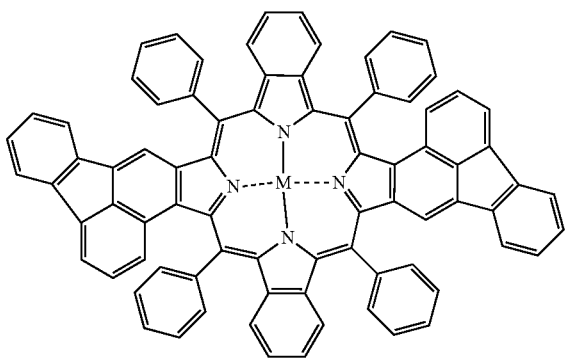

Chemical Formula 1-8

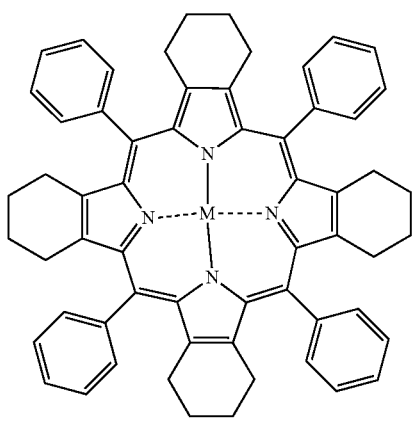

-continued

Chemical Formula 1-9

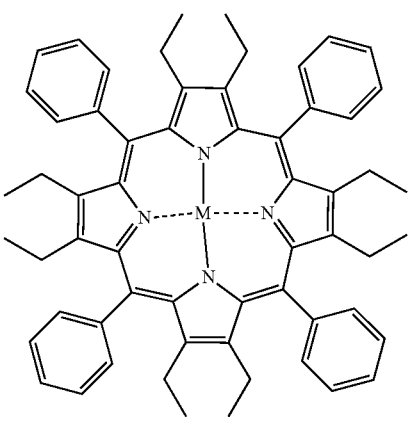

Chemical Formula 1-10

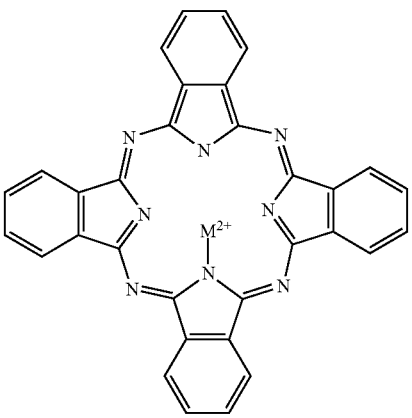

In Chemical Formula 1-1 to Chemical Formula 1-10, M denotes Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, lanthanides, or actinides.

In the present exemplary embodiment, a DAD (donor-acceptor-donor) compound may correspond, for example, to Chemical Formula 2, Chemical Formula 3, or Chemical Formula 4. Chemical Formula 3 may be BEDOT-TQMe$_2$ (4,9-bis(2,3-dihydrothieno[3,4-b][1,4]dioxin-5-yl)-6,7-dimethyl-[1,2,5]thiadiazolo[3,4-g]quinoxaline). Chemical Formula 4 may be BEDOT-BBT (4,8-bis(2,3-dihydrothieno-[3,4-b][1,4]dioxin-5-yl)benzo[1,2-c; 4,5-c']bis[1,2,5]thiadiazole)

Chemical Formula 2

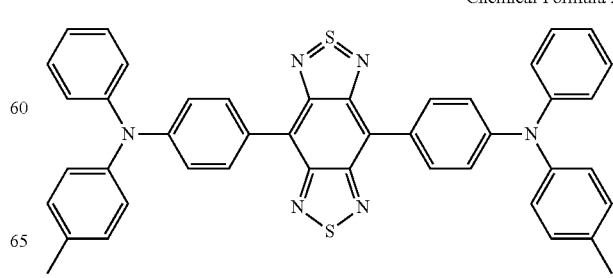

Chemical Formula 3

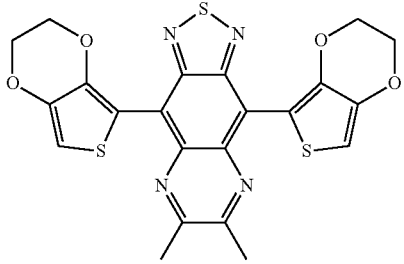

Chemical Formula 4

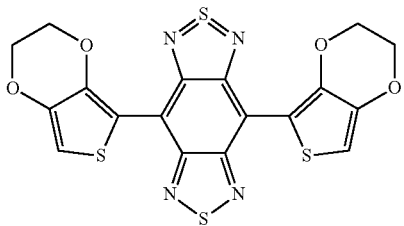

In the present exemplary embodiment, a lanthanide compound may be a compound, for example, represented by Chemical Formula 5, Chemical Formula 6, Chemical Formula 7, Chemical Formula 8, or Chemical Formula 9.

[Z(L)$_3$]$_p$M]A$_q$  Chemical Formula 5

In Chemical Formula 5, Z denotes a carbon atom or a fragment of R$^1$—B, p denotes 1, 2, or 3, q denotes 3-p, A denotes a counterion, and R$^1$ denotes: i) an aryl selectively substituted with hydrogen, an 1 to 5 halogen or an 1C to 8C alkyl group, or an aralkyl group selectively substituted with 1 to 5 halogen or an C1 to C8 alkyl group; or ii) a C1 to C6 alkyl group selectively substituted with at least one halogen element, a C1 to C6 alkenyl group selectively substituted with least one halogen element, or a C1 to C6 alkynyl group selectively substituted with least one halogen element. M denotes a trivalent lanthanide metal ion, such as Tb, Ce, Eu, Er, Gd, Tm, Sm, and Nd, and a plurality of Ls respectively have covalent bonds with Z, and may be selectively selected from Chemical Formula 5-1 and Chemical Formula 5-2.

Chemical Formula 5-1

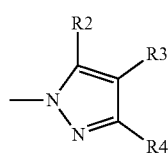

Chemical Formula 5-2

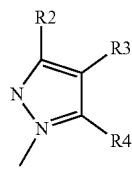

In Chemical Formula 5-1 and Chemical Formula 5-2, R2, R3, and R4 are independently i) a halogen, a cyano group, a nitro group, a sulfone group, an amino group, a C1 to C6 alkylamino group, a C1 to C6 alkylamido group, a carboxyl group, a C1 to C6 alkyloxycarbonyl group, a hydroxy group, a C1 to C6 alkoxy group, a C1 to C6 alkylcarbonyloxy group, a C1 to C6 alkylcarbonyl group, a C1 to C6 haloalkoxy group, or hydrogen, ii) an aryl group or an aralkyl group selectively substituted with one or more of the above-stated groups, or iii) a C1 to C6 alkyl group selectively substituted with one or more of the above-stated groups, a C1 to C6 alkenyl group, or a C1 to C6 alkynyl group. In one embodiment, R2 and R3, or R3 and R4, may be connected with each other to form a fused, a directional or a non-directional L-pyrazolyl ring system.

In Chemical Formula 5, an example of Z(L)$_3$ may be represented by Chemical Formula 5-1-1, Chemical Formula 5-2-1, and Chemical Formula 5-2-2.

Chemical Formula 5-1-1

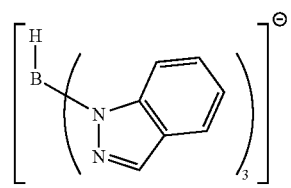

Chemical Formula 5-2-1

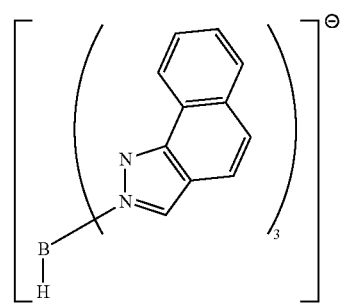

Chemical Formula 5-2-2

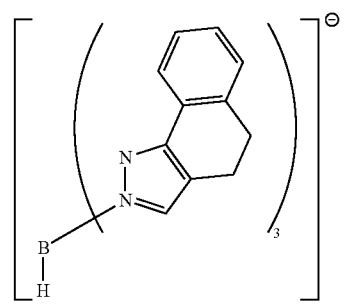

Chemical Formula 6

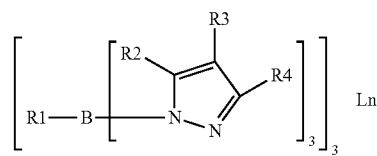

Chemical Formula 7

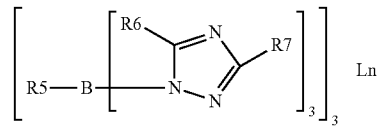

-continued

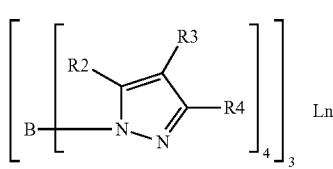

Chemical Formula 8

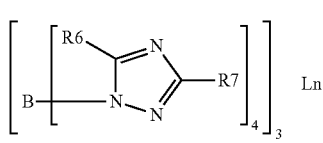

Chemical Formula 9

In Chemical Formula 6 and Chemical Formula 7, Ln denotes $Ce^{3+}$, $Ce^{4+}$, $Pr^{3+}$, $Pr^{4+}$, $Nd^{3+}$, $Nd^{4+}$, $Pm^{3+}$, $Sm^{3+}$, $Sm^{2+}$, $Eu^{3+}$, $Eu^{2+}$, $Gd^{3+}$, $Tb^{3+}$, $Tb^{4+}$, $Dy^{3+}$, $Dy^{4+}$, $Ho^{3+}$, $Er^{3+}$, $Tm^{3+}$, $Tm^{2+}$, $Yb^{3+}$, $Yb^{2+}$, or $Lu^{3+}$. R1 denotes a substituted or unsubstituted pyrazolyl group, a triazolyl group, a hetero aryl group, an alkyl group, an alkoxy group, a phenolate group, an amine group, or an amide group. R2, R3, R4, R5, R6, and R7 denote a hydrocarbon group that may include hydrogen, a halogen, or selectively a heteroatom (for example, an alkyl group, an aryl group, or a heteroaryl group). In order to enhance volatility of compounds, R2 to R7 may be fluorinated. In Chemical Formula 8 and Chemical Formula 9, Ln, R2, R3, R4, R6, and R7 may be applied with the contents described with reference to Chemical Formula 6 and Chemical Formula 7.

An example of the lanthanide compound may be a compound represented by Chemical Formula 10.

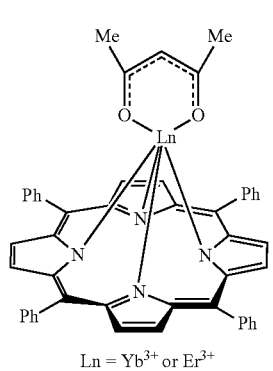

Chemical Formula 10

Ln = $Yb^{3+}$ or $Er^{3+}$

Pixel defining layers 25 may be between neighboring emission layers 150 of the red emission layer 150R, the green emission layer 150G, the infrared ray emission layer 150IR, and the blue emission layer 150B.

The electron transport layer 160 and the electron injection layer 180 are between the emission layer 150 and the second electrode 190. The electron transport layer 160 is adjacent to the emission layer 150. The electron injection layer 180 is adjacent to the second electrode 190.

The electron transport layer 160 may include an organic material, e.g., electron transport layer 160 may include one or more of Alq3 (tris(8-hydroxyquinolino)aluminum), PBD (2-[4-biphenyl-5-[4-tert-butylphenyl]]-1,3,4-oxadiazole), TAZ (1,2,4-triazole), spiro-PBD (spiro-2-[4-biphenyl-5-[4-tert-butylphenyl]]-1,3,4-oxadiazole), and BAlq (8-hydroxyquinoline beryllium salt).

The electron transport layer 160 may transfer electrons from the second electrode 190 to the emission layer 150. The electron transport layer 160 may also prevent holes injected from the first electrode 120 from moving to the second electrode 190 through the emission layer 150. For example, the electron transport layer 160 may serve as a hole blocking layer to help holes and electrons combine in emission layer 150.

The electron injection layer 180 serves to enhance electron injection into the electron transport layer 160 from the second electrode 190. The electron injection layer 180 may include an ionic compound which a first component and a second component are combined. The first component is an element that becomes a positive ion when the ionic compound is ionized. The second component may be an element that becomes a negative ion. In the present exemplary embodiment, the electron injection layer 180 may have a predetermined thickness (e.g., about 2 Å to about 25 Å) taking into consideration a process margin.

The electron injection layer 180 and the second electrode 190 are commonly disposed between the red emission layer 150R and the capping layer 200, between the green emission layer 150G and the capping layer 200, and between the blue emission layer 150B and the capping layer 200. The thickness of the electron injection layer 180 and the thickness of the second electrode 190 may be substantially equal where the electron injection layer 180 and the second electrode 190 are commonly disposed.

In the present exemplary embodiment, an auxiliary layer BIL may be below the blue emission layer 150B to enhance efficiency of the blue emission layer 150B. The auxiliary layer BIL serves to enhance efficiency of the blue emission layer 150B by adjusting a hole charge balance. The auxiliary layer BIL may include a compound represented by Chemical Formula A.

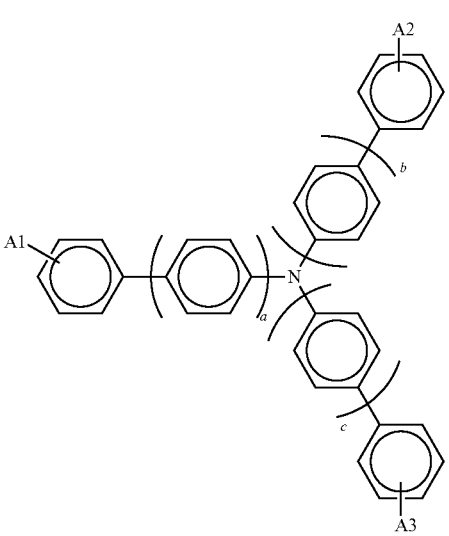

Chemical Formula A

In Chemical Formula A, A1, A2, and A3 may respectively be hydrogen, an alkyl group, an aryl group, carbazole, dibenzothiophene, dibenzofuran (DBF), and biphenyl, and a, b, and c may respectively be integers of 0 to 4.

In the light emitting display device according to the present exemplary embodiment, a red resonance auxiliary layer 150R' may be below the red emission layer 150R and a green resonance auxiliary layer 150G' may be below the green emission layer 150G. The red resonance auxiliary layer 150R' and the green resonance auxiliary layer 150G' may be added to adjust a resonance distance of each color. An additional resonance auxiliary layer between the blue emission layer 150B and the hole transport layer 130 may not be formed below blue emission layer 150B and auxiliary layer BIL.

In the present exemplary embodiment, the green resonance auxiliary layer 150G' may be below the infrared ray emission layer 150IR. For example, when a resonance auxiliary layer below the green emission layer 150G is called a first auxiliary layer. and an auxiliary layer below the infrared ray emission layer 150IR is called a second auxiliary layer, the first auxiliary layer and the second auxiliary layer are green resonance auxiliary layers 150G'. For example, the first auxiliary layer and the second auxiliary layer may be the same. Thus, the first auxiliary layer and the second auxiliary layer may be made of the same material and may be disposed in the same layer.

The infrared ray emission layer 150IR may be in the same layer as the green emission layer 150G. In order to form such a structure, the green resonance auxiliary layer 150G' is formed in an area that corresponds to the first pixel G and the infrared ray emission portion IR of FIG. 1, the green emission layer 150G is formed on the green resonance auxiliary layer 150G' of the first pixel G, and then the infrared ray emission layer 150IR is formed on the green resonance auxiliary layer 150G' of the infrared ray emission portion IR using, for example, a thermal evaporation method or inkjet method. The green emission layer 150G and the infrared ray emission layer 150IR may be between neighboring pixel defining layers 25. The infrared ray emission portion IR of the present exemplary embodiment may have a predetermined or optimum resonance thickness between a resonance thickness of the first pixel G and a resonance thickness of the second pixel R.

Figure 3:
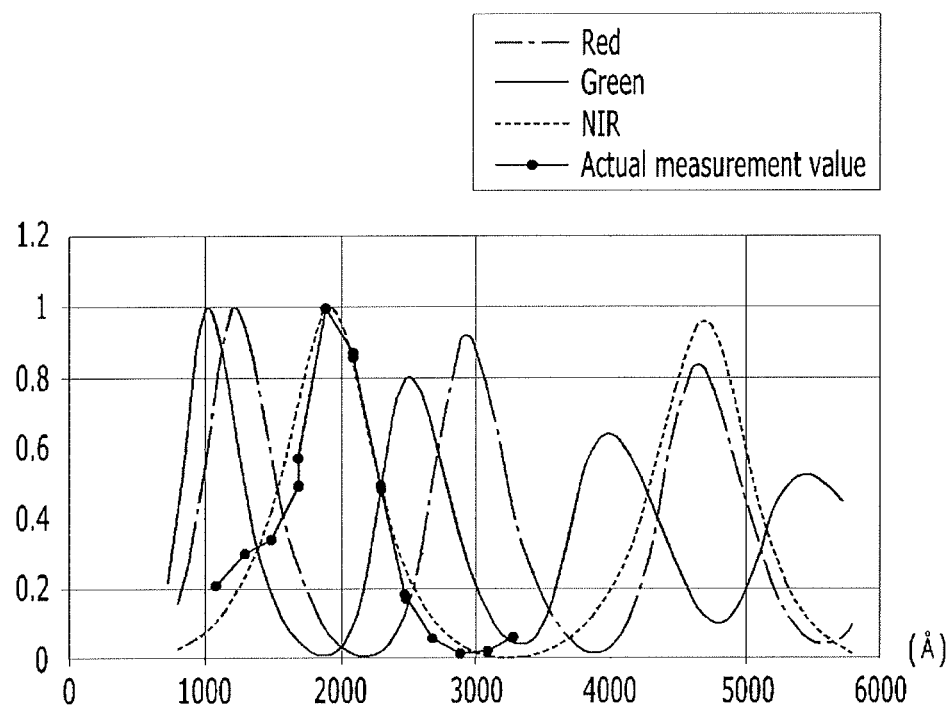
FIG. 3 illustrates an example of optimized luminous intensity.

FIG. 3 illustrates an example of optimum luminous intensity depending on thicknesses in the red pixel, the green pixel, and the infrared ray emission portion. In FIG. 3, "Red" denotes a red pixel, "Green" denotes a green pixel, and "NIR" denotes an infrared ray light emission portion.

Referring to FIG. 3, the optimum resonance thickness of the infrared ray emission portion is between a secondary resonance thickness (e.g., a thickness that corresponds to the secondary peak) of the green pixel and a primary resonance thickness (e.g., a thickness that corresponds to the primary peak) of the red pixel. Since the primary resonance thickness of the infrared ray emission portion is close to the secondary resonance thickness of the green pixel, when the infrared ray auxiliary layer and the infrared ray emission layer are formed to be similar to those of the green pixel, the infrared ray emission portion may be formed through a simple process while minimizing a reduction of efficiency in the present exemplary embodiment.

The infrared ray auxiliary layer of the infrared ray emission portion is formed as the green resonance auxiliary layer and the infrared ray emission layer is formed to be thinner than the green emission layer to thereby increase or maximize primary resonance efficiency of the infrared ray emission portion. As an exemplary variation, when the green pixel has a thickness of the primary resonance thickness, the infrared ray emission layer may be thicker than the green emission layer to increase or maximize primary resonance efficiency of the infrared ray emission portion.

Figure 4:
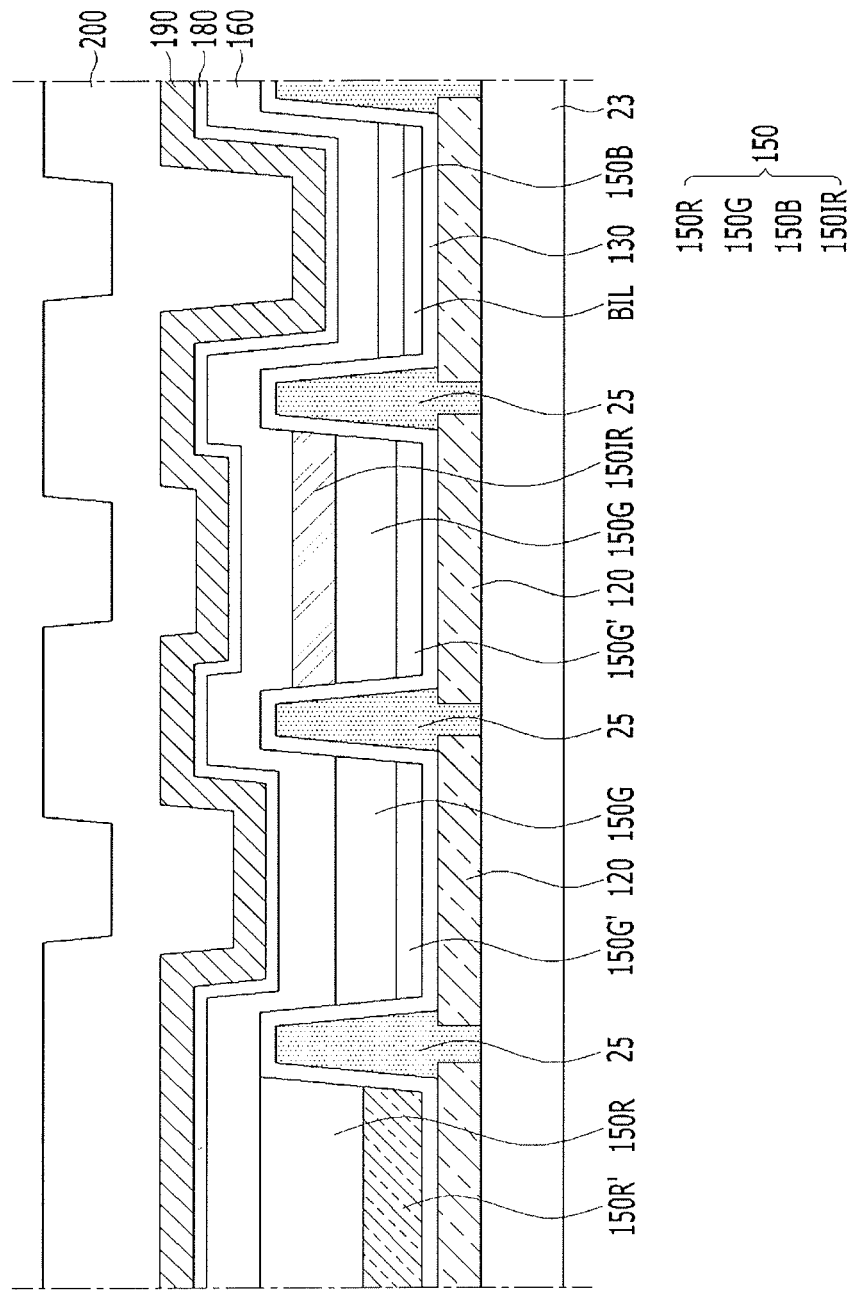
FIG. 4 illustrates an embodiment of the infrared ray emission portion.

FIG. 4 illustrates a cross-sectional view of another embodiment of the infrared ray emission portion of FIG. 2. The exemplary embodiment of FIG. 4 may be the same as the exemplary embodiment of FIG. 2 except as follows.

Referring to FIG. 4, a green emission layer 150G is between an infrared ray emission layer 150IR and a green resonance auxiliary layer 150G'. For example, when the green emission layer 150G in the first pixel G of FIG. 1 is called a first emission layer and the green emission layer 150G in the infrared ray emission portion IR of FIG. 1 is called a second emission layer, the first emission layer and the second emission layer may be the same as the green emission layer 150G. Thus, the first emission layer and the second emission layer may be made of the same material and may be in the same layer.

Similar to the manufacturing method of FIG. 2, a green resonance auxiliary layer 150G' and a green emission layer 150G are in an area that corresponds to the first pixel G and the infrared ray emission portion IR of FIG. 1 using, for example, a thermal evaporation method or an inkjet method. Then, an infrared ray emission layer 150IR may be formed on the green emission layer 150G of the infrared ray emission portion IR to form a light emitting element structure according to the present exemplary embodiment.

Figure 5:
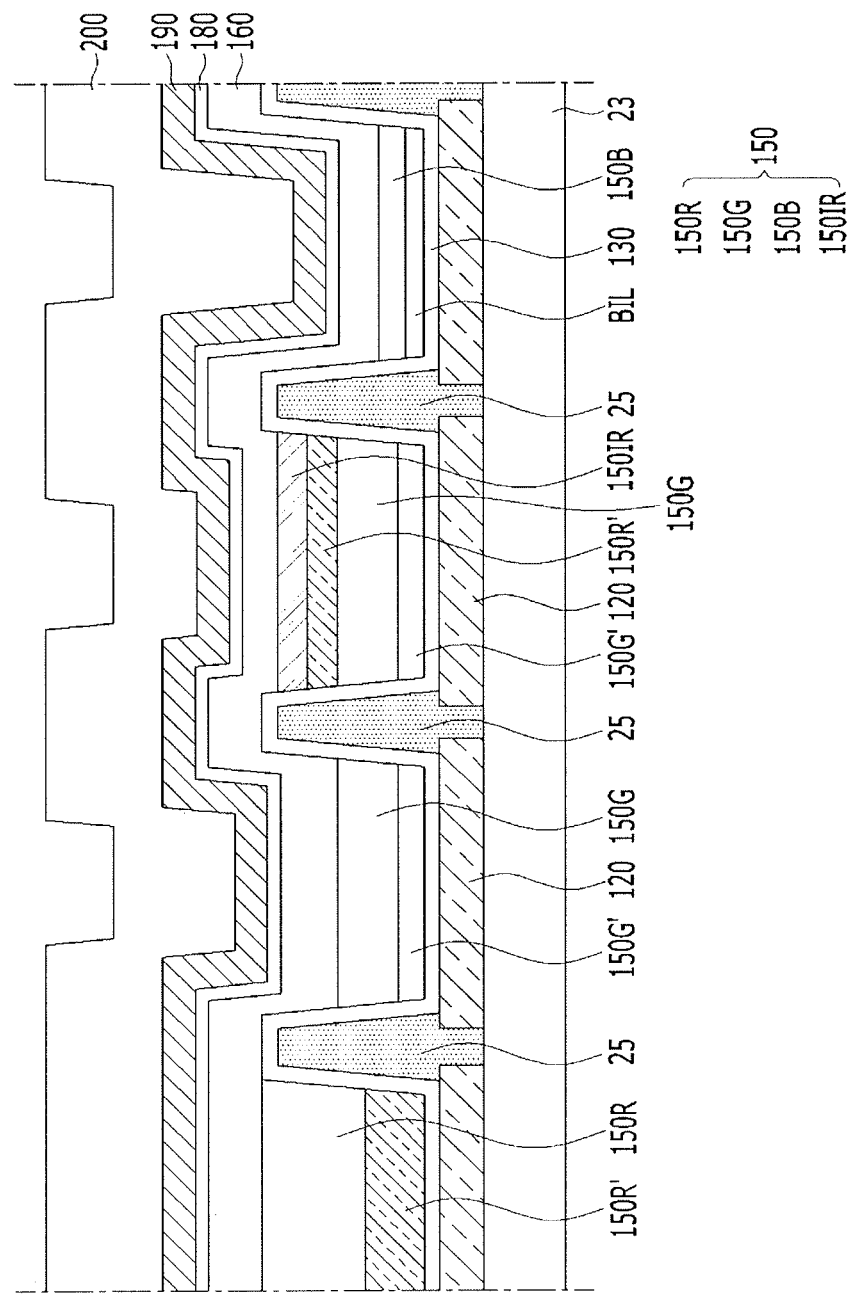
FIG. 5 illustrates another embodiment of the infrared ray emission portion.

FIG. 5 illustrates a cross-sectional view of another embodiment of the infrared ray emission portion of FIG. 2. The exemplary embodiment of FIG. 5 may be the same as the exemplary embodiment of FIG. 4 except as follows.

Referring to FIG. 5, a red resonance auxiliary layer 150R' is between an infrared ray emission layer 150IR and a green emission layer 150G. For example, the auxiliary layer in the second pixel R of FIG. 1 is called a third auxiliary layer and the auxiliary layer between the infrared ray emission layer 150IR and the green emission layer 150G is called a fourth auxiliary layer. The third auxiliary layer and the fourth auxiliary layer may be the same as the red resonance auxiliary layer 150R'. Thus, the third auxiliary layer and the fourth auxiliary layer may be made of the same material and may be in the same layer. The meaning of the third auxiliary layer and the fourth auxiliary layer being in the same layer may include the case where the third auxiliary layer and the fourth auxiliary layer are formed through the same process, but is this is not necessary in all embodiments.

For example, a green resonance auxiliary layer 150G' and a green emission layer 150G may be formed in an area corresponding to the first pixel G and the infrared ray emission portion IR of FIG. 1. A red resonance auxiliary layer 150R' may be formed in an area that corresponds to the second pixel R1 and an area that corresponds to the infrared ray emission portion IR of FIG. 1, in a state in which a mask is changed or shifted. After that, an infrared ray emission layer 150IR may be formed on the red resonance auxiliary layer 150R' of the infrared ray emission portion IR of FIG. 1.

According to the exemplary embodiment of FIG. 5, the infrared ray emission portion may be thicker than a thickness of the green pixel due to forming the red resonance auxiliary layer 150R'. Thus, according to the present exemplary embodiment, the resonance thickness of the infrared ray emission portion may be optimized (or achieve some other predetermined value relative) to the secondary resonance thickness when the graph of FIG. 3 is referred to.

Figure 6:
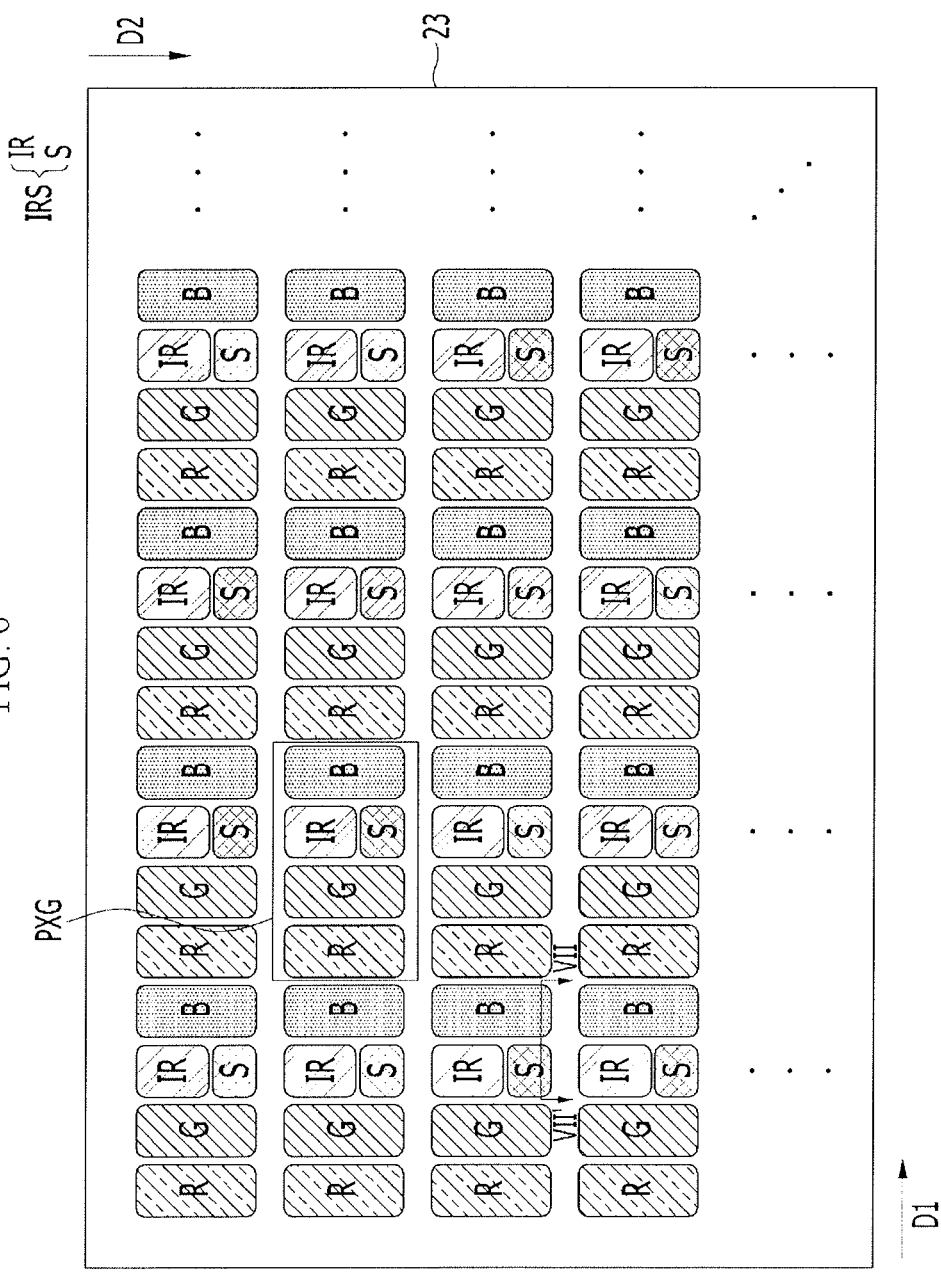
FIG. 6 illustrates another embodiment of pixels, an infrared ray emission portion, and an infrared ray receiving portion.

FIG. 6 illustrates a top plan view of another layout embodiment of pixels, infrared ray emission portions, and infrared ray receiving portions. The exemplary embodiment of FIG. 6 may be the same as the embodiment of FIG. 1 except as follows.

Referring to FIG. 6, a substrate 23 includes first pixels G, second pixels R, and third pixels B, and also includes infrared ray sensors IRS, each including an infrared ray emission portion IR and an infrared ray receiving portion S.

In the present exemplary embodiment, the infrared ray receiving portion S is an area for sensing external light. For example, light emitted from the infrared ray emission portion IR is reflected by colliding with an object to be sensed. The infrared ray receiving portion S receives the reflected light to determine presence of an object, proximity, movement, brightness, and/or another value.

In a plan view, the infrared ray emission portion IR and the infrared ray receiving portion S may be the first pixel G and the second pixel B, but may be at other locations in another embodiment. The infrared ray emission portion IR and the infrared ray receiving portion S may be between the first pixel G and the second pixel R or between the second pixel R and the third pixel B. In FIG. 6, the infrared ray emission portion IR and the infrared ray receiving portion S may be arranged along a second direction D, and a vertical alignment thereof may be changed. For example, in FIG. 6, the infrared ray emission portion IR is above the infrared ray receiving portion S, but the infrared ray emission portion IR may be below the infrared ray receiving portion S.

A transparent window and a sensor layer may be in the infrared ray receiving portion S and may overlap each other along a direction crossing an upper surface of the substrate 23. An example will be described with reference to FIG. 7.

Figure 7:
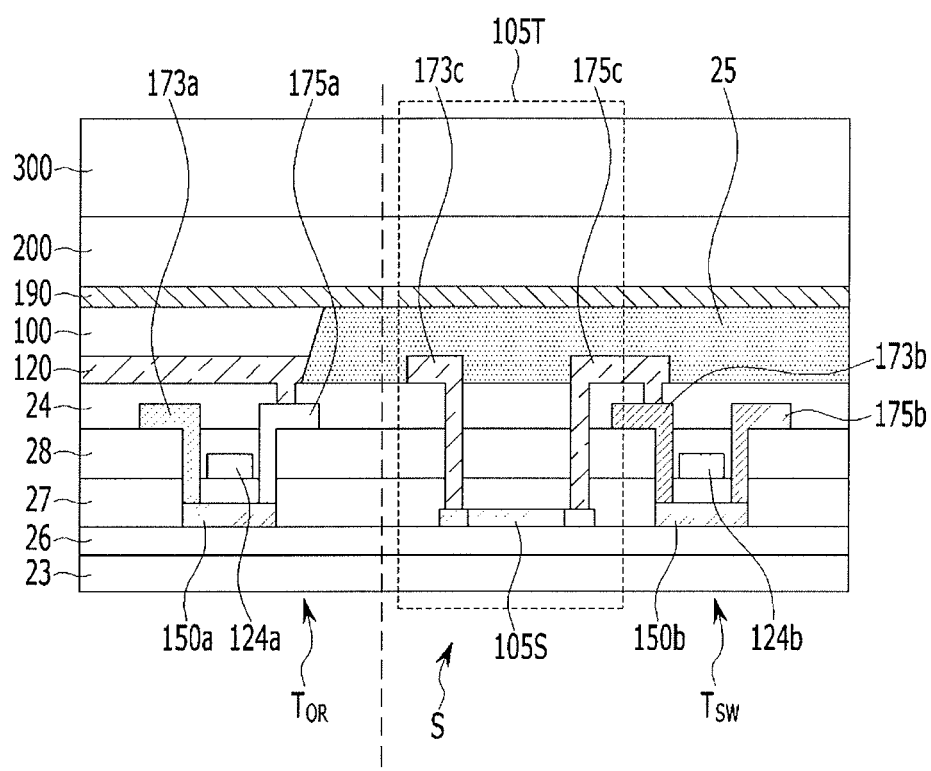
FIG. 7 illustrates an embodiment the infrared ray receiving portion.

FIG. 7 illustrates a cross-sectional view of another embodiment of the infrared ray receiving portion taken along line VII-VII' in FIG. 6. In FIG. 7, the left side schematically shows a pixel structure and the right side schematically shows the infrared ray receiving portion.

Referring to FIG. 7, in the pixel structure, a buffer layer 26 is on the substrate 23 to prevent permeation of moisture, oxygen, and the like. A driving semiconductor layer 150a is on the buffer layer 26. The driving semiconductor layer 150a may include a source area and a drain area. The source area and the drain area are at respective lateral ends of the driving semiconductor layer 150a and doped with an impurity. A gate insulation layer 27 is on the driving semiconductor layer 150a. A gate wire that includes a driving gate electrode 124a is on the gate insulation layer 27. In addition, the driving gate electrode 124a overlaps at least a part of the driving semiconductor layer 150a, that is, a channel area of the driving semiconductor layer 150a.

An interlayer insulation layer 28 that covers the driving gate electrode 124a is on the gate insulation layer 27. A data wire that includes a driving source electrode 173a and a driving drain electrode 175a may be on the interlayer insulation layer 28. In addition, the driving source electrode 173a and the driving drain electrode 175a are respectively connected with the source area and the drain area of the driving semiconductor layer 150a through a contact hole in the interlayer insulation layer 28 and the gate insulation layer 27.

Thus, a driving transistor $T_{OR}$ is formed that includes the driving semiconductor layer 150a, the driving gate electrode 124a, the driving source electrode 173a, and the driving drain electrode 175a. The driving transistor $T_{OR}$ may have a different structure or configuration in another embodiment. In one embodiment, planarization layer 24 or the interlayer insulation layer 28 may be omitted.

The light emitting element has first electrode 120 on the planarization layer 24. A pixel defining layer 25 is on the planarization layer 24 and the first electrode 120. An opening that partially overlaps the first electrode 120 is in the pixel defining layer 25. In this case, a light emitting element layer 100 may be in every opening formed by the pixel defining layer 25.

The light emitting element layer 100 is on first electrode 120 and corresponds to the hole transport layer 130, the emission layer 150, the electron transport layer 160, and the electron injection layer 180 of the light emitting element in FIG. 2. The content related to the light emitting element described with reference to FIGS. 4 and 5 may be applied to the display device of the present embodiment.

In FIG. 7, the light emitting element layer 100 is only in the opening of the pixel defining layer 25. Layers that form the light emitting element layer 100 may be partially on an upper surface of the pixel defining layer 25 like a second electrode 190.

The second electrode 190 and a capping layer 200 are on the light emitting element layer 100. An encapsulation layer 300 is on the capping layer 200. The encapsulation layer 300 protects a light emitting element and a driving circuit on the substrate 23 from outside effects by sealing them.

The infrared ray receiving portion S may have, for example, a diode structure. A sensor layer 105S is on the substrate 23, and opposite edges of the sensor layer 105S may be doped with n-type and p-type impurities, respectively. Thus, the sensor layer 105S may include an intrinsic semiconductor area, an n-type semiconductor area, and a p-type semiconductor area, and the n-type semiconductor area and the p-type semiconductor area disposed at opposite ends of the intrinsic semiconductor area. The sensor layer 105S may include Si, InGeAs, or another material, and, for example, may be made of a material that may serve as an optical sensor.

The infrared ray receiving portion S includes a source electrode 173c and a drain electrode 175c, in addition to the sensor layer 105S. The buffer layer 26 is on the substrate 23. The gate insulation layer 27 is provided on the buffer layer 26. The sensor layer 105S of the infrared ray receiving portion S is connected with the source electrode 173c and the drain electrode 175c through contact holes in the interlayer insulation layer 28, the gate insulation layer 27, and the planarization layer 24.

The source and drain electrodes 173c and 175c are on the same layer as the first electrode 120 of the light emitting element and are made of the same material as the first electrode 120. The pixel defining layer 25 covers the source and drain electrodes 173c and 175c. The second electrode 190 of the light emitting element is formed by extending above the pixel defining layer 25. The capping layer 200 is on the second electrode 190, and the encapsulation layer 300 is on the capping layer 200.

The infrared ray receiving portion S may include a transparent window 105T that overlaps the sensor layer 105S to receive external infrared rays. For example, the transparent window 105T may include an area of the infrared ray receiving portion S, which overlaps the sensor layer 105S. The transparent window 105T may include the first electrode 120, the second electrode 190, and the pixel defining layer 25 that are between the first electrode 120 and the second electrode 190. The first electrode 120 and the second electrode 190 include a transparent conductive material.

The infrared ray receiving portion S may further include a switching transistor $T_{SW}$ for transmission of a received signal. The switching transistor $T_{SW}$ includes a switching semiconductor layer 150b, a switching gate electrode 124b, and source and drain electrodes 173b and 175b. The switching transistor $T_{SW}$ may be adjacent to the infrared ray receiving portion S and may be connected with the infrared ray receiving portion S by an additional wire at a distance from the infrared ray receiving portion S.

The switching transistor $T_{SW}$ may have, for example, the same structure as the driving transistor $T_{OR}$ of the pixel. The switching transistor $T_{SW}$ having such a structure may be formed simultaneously when the driving transistor $T_{OR}$ of the pixel is formed.

The drain electrode 175c of the infrared ray receiving portion S is connected with the source electrode 173b of the switching transistor $T_{SW}$ through a contact hole in the planarization layer 24. In an exemplary embodiment, the drain electrode 175c of the infrared ray receiving portion S may be electrically connected with the source electrode 173b of the switching transistor $T_{SW}$ through an additional connection wire.

In the above description, the sensor layer 105S is between the substrate 23 and the gate insulation layer 27. In one embodiment, the sensor layer 105S may be at a different location depending, for example, on a variation structure of the infrared ray receiving portion S between the substrate 23 and the first electrode 120. The sensor layer 105S may be made of, for example, an organic material instead of an inorganic-based material. In this case, the infrared ray receiving portion S may be formed, for example, in a process for forming organic layers of the light emitting element layer 100, and the sensor layer 105S may be between the first electrode 120 and the second electrode 190.

Figure 8:
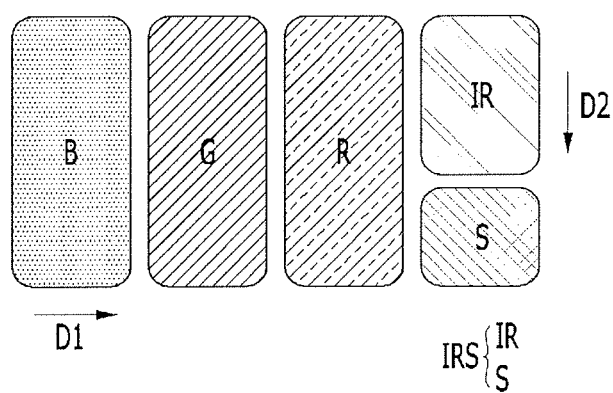
FIG. 8 illustrates another layout embodiment of a group of pixels.

FIG. 8 illustrates a top plan view of another embodiment the layout of the pixel group of FIG. 6. Referring to FIG. 8, unlike the pixel group PXG of FIG. 6, a pixel group PXG is formed in the order of a third pixel B, a first pixel G, a second pixel R, and an infrared ray sensor IRS. Such a pixel group PXG may be arranged vertically and horizontally. The third pixel B, the first pixel G, and the second pixel R are arranged along a first direction D1, and an infrared ray emission portion IR and an infrared ray receiving portion S are arranged along a second direction D2.

Figure 9:
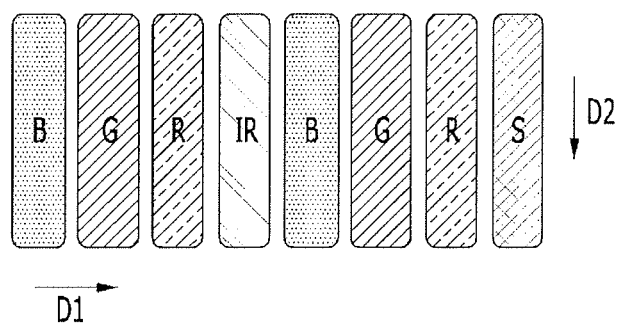
FIG. 9 illustrates another layout embodiment of a group of pixels.

FIG. 9 illustrates a top plan view of another embodiment of the pixel group of FIG. 6. Referring to FIG. 9, unlike the pixel group PXG of FIG. 6, an infrared ray emission portion IR and an infrared ray receiving portion S are not arranged adjacent to each other along a second direction D1. Also, a first pixel G, a second pixel R, and a third pixel B are between the infrared ray emission portion IR and the infrared ray receiving portion S. For example, not only the first pixel G, the second pixel R, and the third pixel B, but also the infrared ray emission portion IR and the infrared ray receiving portion S, are arranged along the first direction D1. The third pixel B, the first pixel G, the second pixel R, the infrared ray emission portion IR, the third pixel B, the first pixel G, the second pixel R, and the infrared ray receiving portion S may be alternately arranged along the first direction D1, but may be in another order or arrangement in another embodiment. For example, the order of arrangement along the first direction D1 may be changed.

Figure 10:
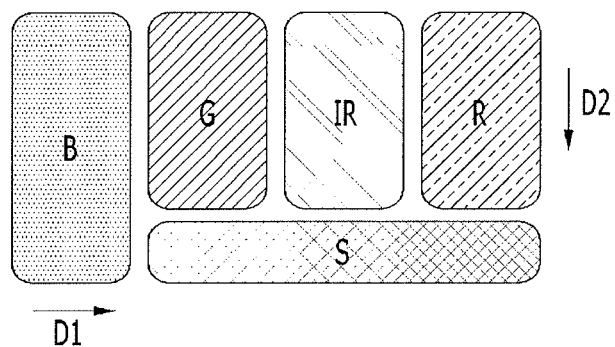
FIG. 10 illustrates another layout embodiment of a group of pixels.

FIG. 10 illustrates a top plan view of another embodiment of the pixel group of FIG. 6. Referring to FIG. 10, an infrared ray emission portion IR is between a first pixel G and a second pixel R, the first pixel G, the infrared ray emission portion IR, and the second pixel R are arranged along a first direction D1. An infrared ray receiving portion S is arranged along the first pixel G and the second pixel R and a second direction D2.

Figure 11:
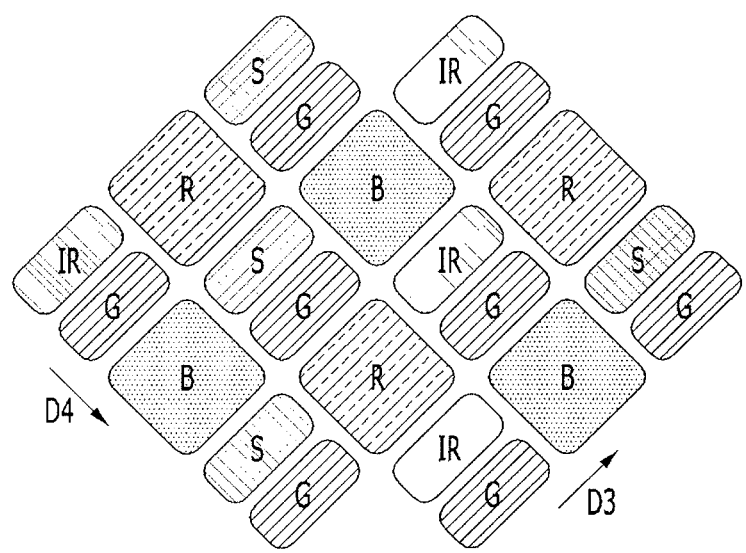
FIG. 11 illustrates another layout embodiment of a group of pixels.
Figure 12:
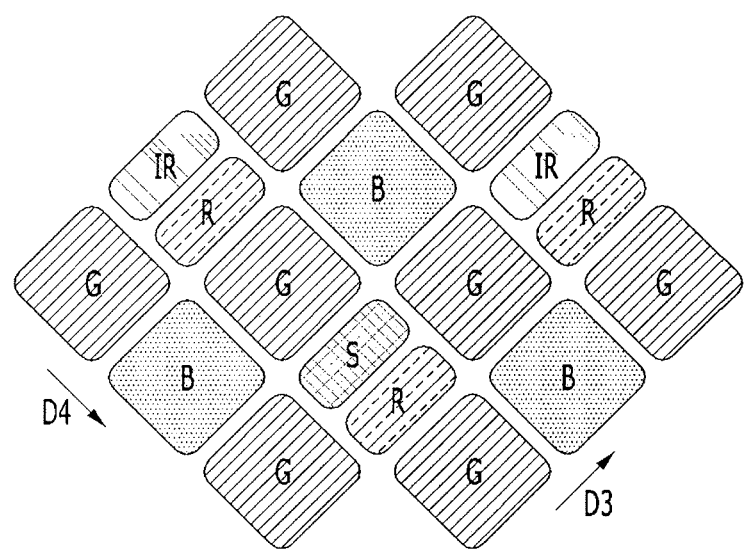
FIG. 12 illustrates another layout embodiment of a group of pixels.
Figure 13:
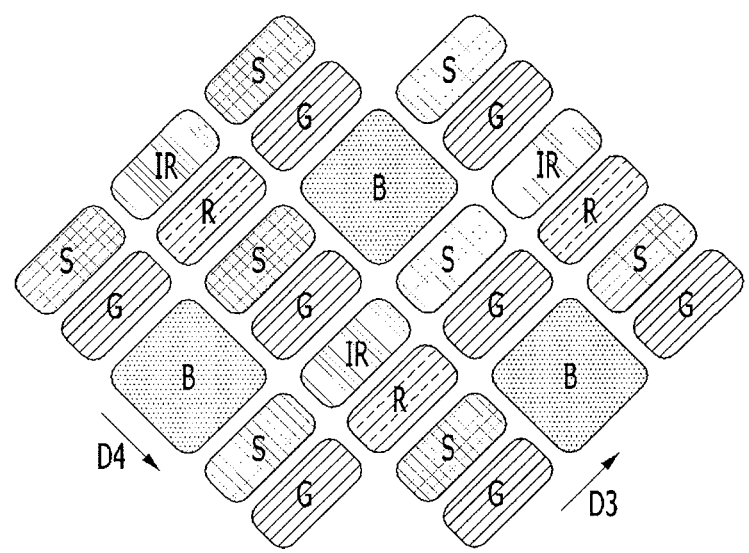
FIG. 13 illustrates another layout embodiment of a group of pixels.

FIGS. 11 to 13 illustrate top plan views of additional embodiments of pixel groups corresponding, for example, to FIG. 6. Referring to FIGS. 11 to 13, at least one of an infrared ray emission portion IR and an infrared ray receiving portion S is arranged with a first pixel G and a second pixel R along a third direction D3, and is arranged with a third pixel B along a fourth direction D4. In the exemplary embodiment of FIG. 11, the infrared ray emission portion IR and the first pixel G are disposed by dividing an area that corresponds to the second pixel R or the third pixel B. Similarly, the infrared ray receiving portion S and the first pixel G are disposed by dividing an area that corresponds to the second pixel R or the third pixel B. In the exemplary embodiment of FIG. 12, the infrared ray emission portion IR and the second pixel R are disposed by dividing an area that corresponds to the first pixel G or the third pixel B. Similarly, the infrared ray receiving portion S and the second pixel R are disposed by dividing an area that corresponds to the first pixel G or the third pixel B.

In the exemplary embodiments of FIGS. 11 and 12, the infrared ray emission portion IR and the infrared ray receiving portion S both divide an area with the same pixel. For example, in FIG. 11, the infrared ray emission portion IR and the infrared ray receiving portion S are disposed by dividing an area with the first pixel G. In FIG. 12, the infrared ray emission portion IR and the infrared ray receiving portion S are disposed by dividing an area with the second pixel R. However, in the exemplary embodiment of FIG. 13, the infrared ray emission portion IR and the infrared ray receiving portion S are disposed by dividing an area with different pixels, respectively. For example, the infrared ray emission portion IR and the second pixel R are disposed by dividing an area that corresponds to the third pixel B, and the infrared ray receiving portion S and the first pixel G are disposed by dividing an area that corresponds to the third pixel B.

Figure 14:
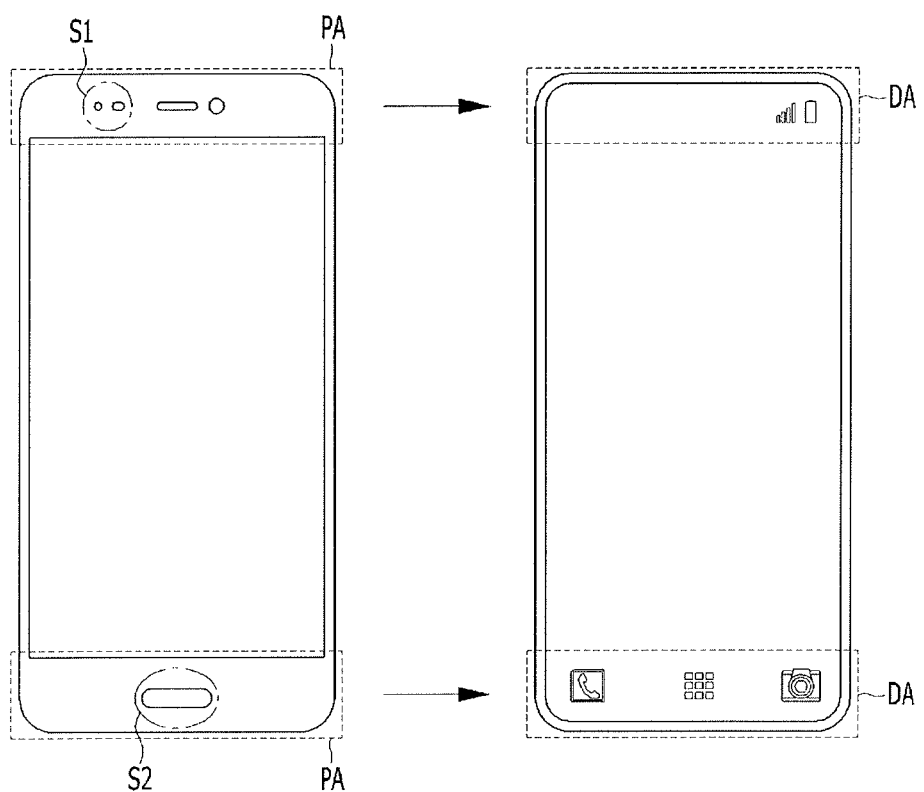
FIG. 14 illustrates an embodiment of a light emitting display device.

FIG. 14 illustrates another embodiment of a light emitting display device in which an infrared ray sensor is formed according to an exemplary embodiment. In FIG. 14, the left side shows a light emitting display device where a first sensor Si and a second sensor S2 are formed in a peripheral area PA. In this case, the first sensor Si may serve as a proximity sensor and the second sensor S2 may serve as a fingerprint sensor by applying a physical button.

In such a light emitting display device, an additional sensor module may be included to cause complexity in a manufacturing process of the light emitting display device. In FIG. 14, the right side shows a light emitting display device where a display area DA extends to an outer edge. When the layouts of the pixels and the infrared ray sensor according to the above-described exemplary embodiments are used, the physical button may be removed as shown in the right side of FIG. 14. As a result, a light emitting display device capable of displaying a full front side thereof may be implemented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A light emitting display device, comprising:
a substrate including a first pixel, a second pixel, a third pixel, an infrared emission portion, and an infrared receiving portion, the first pixel, the second pixel, and the third pixel configured to emit light of different colors;
a first electrode on the substrate;
a second electrode overlapping the first electrode;
an emission layer between the first electrode and the second electrode; and
an auxiliary layer disposed between the first electrode and the emission layer, wherein the auxiliary layer includes a first auxiliary layer disposed on the first pixel and a second auxiliary layer disposed in the infrared emission portion, and wherein the first auxiliary layer and the second auxiliary layer include a same material of a color resonance auxiliary layer,
wherein the first pixel, the second pixel, the third pixel, and the infrared emission portion are spaced from each other in a plan view, and
wherein an infrared sensor portion includes the infrared emission portion and the infrared receiving portion and wherein the infrared emission portion and the infrared receiving portion are disposed between neighboring pixels among the first pixel, the second pixel, and the third pixel.

2. The light emitting display device as claimed in claim 1, wherein:
the first pixel, the second pixel, and the third pixel are arranged along a first direction, and
the infrared emission portion and the infrared receiving portion are arranged along a second direction crossing the first direction.

3. The light emitting display device as claimed in claim 1, wherein:
the first pixel, the second pixel, and the third pixel are arranged along a first direction, and
the infrared emission portion and the infrared receiving portion are arranged along the first direction.

4. The light emitting display device as claimed in claim 3, wherein the first pixel, the second pixel, and the third pixel are between the infrared emission portion and the infrared receiving portion.

5. The light emitting display device as claimed in claim 1, wherein:
the infrared emission portion is between the first pixel and the second pixel,
the first pixel, the infrared emission portion, and the second pixel are arranged along a first direction, and
the first pixel, the second pixel and the infrared receiving portion are arranged along a second direction crossing the first direction.

6. The light emitting display device as claimed in claim 1, wherein:
at least one of the infrared emission portion and the infrared receiving portion is arranged along a third direction with the first pixel and the second pixel and along a fourth direction crossing the third direction with the third pixel.

7. The light emitting display device as claimed in claim 1, wherein:
a transparent window and a sensor layer are in the infrared receiving portion, and
the transparent window and the sensor layer overlap each other along a direction crossing an upper surface of the substrate.

8. The light emitting display device as claimed in claim 7, wherein the sensor layer is between the substrate and the first electrode.

9. The light emitting display device as claimed in claim 8, wherein the transparent window includes a transparent conductive material.

10. A light emitting display device, comprising:
a substrate including a first pixel, a second pixel, a third pixel, and an infrared sensor portion, the first pixel, the second pixel, and the third pixel configured to emit light of different colors;
a first electrode disposed on the substrate;
a second electrode overlapping the first electrode; and
an emission layer disposed between the first electrode and the second electrode,
wherein the infrared sensor portion includes an infrared emission portion and an infrared receiving portion and wherein the infrared emission portion and the infrared receiving portion are disposed between neighboring pixels among the first pixel, the second pixel, and the third pixel,
wherein:
a transparent window and a sensor layer are in the infrared receiving portion, and
the transparent window and the sensor layer overlap each other along a direction crossing an upper surface of the substrate, and
wherein the sensor layer is disposed between the substrate and the first electrode.

11. The light emitting display device as claimed in claim 10, wherein:
the first pixel, the second pixel, and the third pixel are arranged along a first direction, and
the infrared emission portion and the infrared receiving portion are arranged along a second direction crossing the first direction.

12. The light emitting display device as claimed in claim 10, wherein:
the first pixel, the second pixel, and the third pixel are arranged along a first direction, and
the infrared emission portion and the infrared receiving portion are arranged along the first direction.

13. The light emitting display device as claimed in claim 12, wherein the first pixel, the second pixel, and the third pixel are between the infrared emission portion and the infrared receiving portion.

14. The light emitting display device as claimed in claim 10, wherein:
the infrared emission portion is between the first pixel and the second pixel,
the first pixel, the infrared emission portion, and the second pixel are arranged along a first direction, and
the first pixel, the second pixel and the infrared receiving portion are arranged along a second direction crossing the first direction.

15. The light emitting display device as claimed in claim 10, wherein:
at least one of the infrared emission portion and the infrared receiving portion is arranged along a third direction with the first pixel and the second pixel and along a fourth direction crossing the third direction with the third pixel.

16. The light emitting display device as claimed in claim 10, wherein the transparent window includes a transparent conductive material.

* * * * *